United States Patent
Moiseev et al.

(10) Patent No.: US 10,445,077 B2
(45) Date of Patent: Oct. 15, 2019

(54) TECHNIQUES TO REMOVE IDLE CYCLES FOR CLOCK-SENSITIVE THREADS IN HARDWARE SIMULATORS

(71) Applicant: INTEL CORPORATION, Santa Clara, CA (US)

(72) Inventors: Mikhail Moiseev, Hillsboro, OR (US); Roman I. Popov, Hillsboro, OR (US)

(73) Assignee: INTEL CORPORATION, Santa Clara, CA (US)

(*) Notice: Subject to any disclaimer, the term of this patent is extended or adjusted under 35 U.S.C. 154(b) by 5 days.

(21) Appl. No.: 15/825,204

(22) Filed: Nov. 29, 2017

(65) Prior Publication Data

US 2019/0034179 A1    Jan. 31, 2019

(51) Int. Cl.
*G06F 9/44* (2018.01)
*G06F 8/41* (2018.01)
*G06F 17/50* (2006.01)

(52) U.S. Cl.
CPC ............ *G06F 8/4443* (2013.01); *G06F 8/443* (2013.01); *G06F 17/50* (2013.01)

(58) Field of Classification Search
CPC ....................................................... G06F 9/44
See application file for complete search history.

(56) References Cited

U.S. PATENT DOCUMENTS

| | | | |
|---|---|---|---|
| 2002/0172335 A1* | 11/2002 | Narasimhan | G06F 19/3418 379/106.02 |
| 2006/0195310 A1* | 8/2006 | Vermeersch | G06F 17/5022 703/19 |
| 2018/0121622 A1* | 5/2018 | Armstrong | G16H 50/20 |

* cited by examiner

*Primary Examiner* — Jae U Jeon

(57) ABSTRACT

Embodiments may be directed to techniques to detect a clock-sensitive thread in source code, where the clock-sensitive thread executes a task, and transform the clock-sensitive thread into a first method and a second method. The first method generates a timed notification in response to an event, e.g., an input data change or a variable change, where the timed notification corresponds with a clock edge of a clock, and the second method executes the task in response to the timed notification.

25 Claims, 9 Drawing Sheets

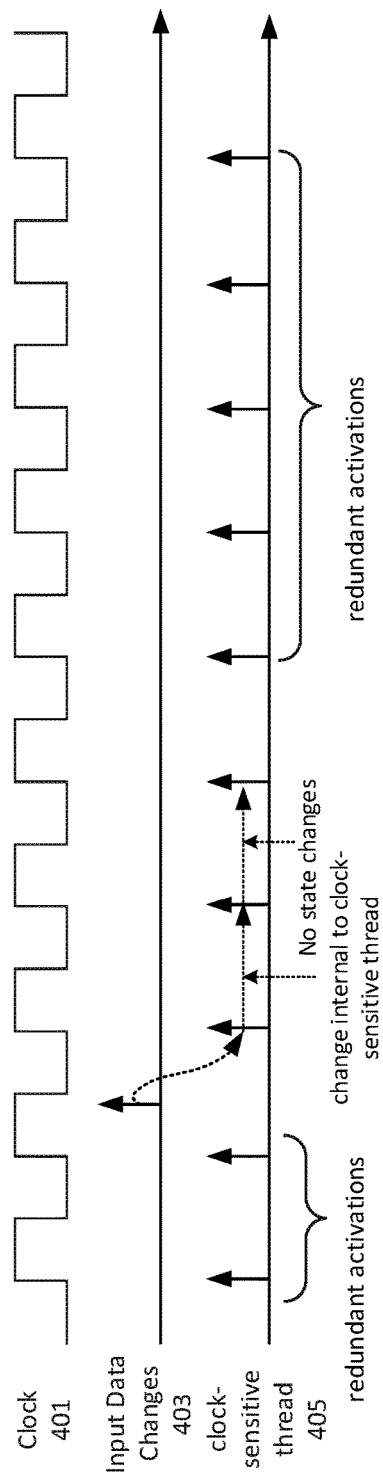

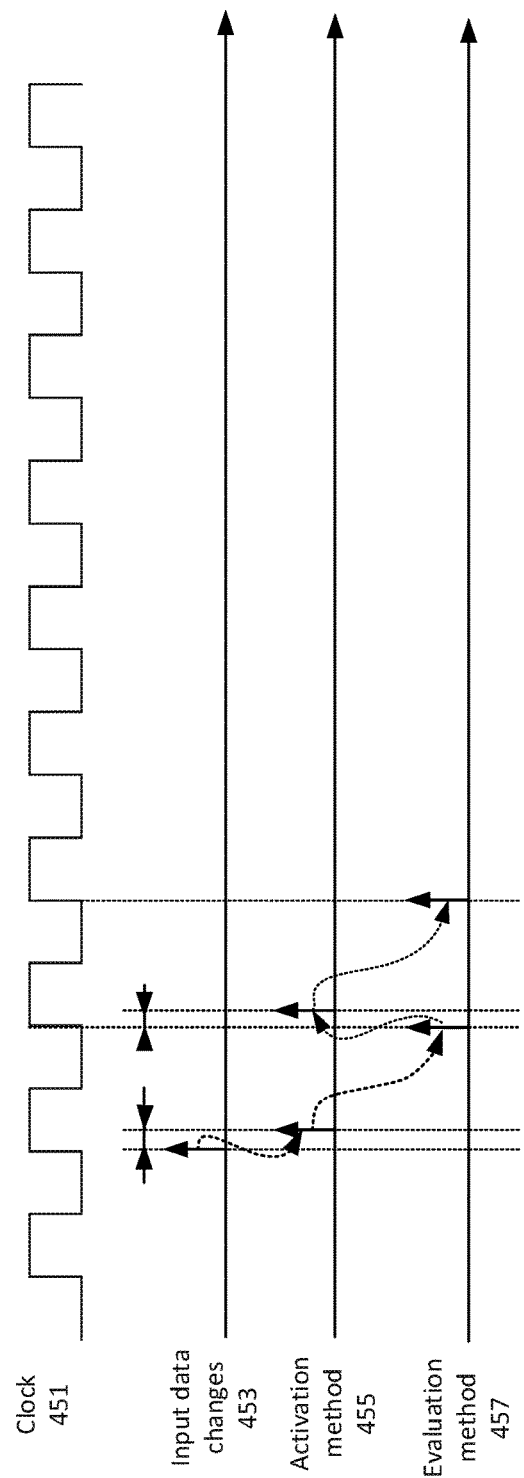

TECHNIQUES TO REMOVE IDLE CYCLES FOR CLOCK-SENSITIVE THREADS IN HARDWARE SIMULATORS

TECHNICAL FIELD

Embodiments described herein include techniques to remove idle cycles for clock-sensitive threads in hardware simulators.

BACKGROUND

Currently, circuits are designed using any number of programming tools including high-level modeling languages such as SystemC. These tools enable a design engineer to design, test, and verify circuits prior to manufacturing the circuit. These tools may include a simulator allowing the design engineer to simulate a performance of the designed circuit and programmed via the SystemC classes and macros. However, in current implementations simulation runtime can become extended and dominated by idle cycles when clock-sensitive processes are executed on each clock edge or event but do not change a model state.

BRIEF DESCRIPTION OF THE DRAWINGS

FIG. 4 illustrates an example of a logic flow diagram.

DETAILED DESCRIPTION

Figure 1:
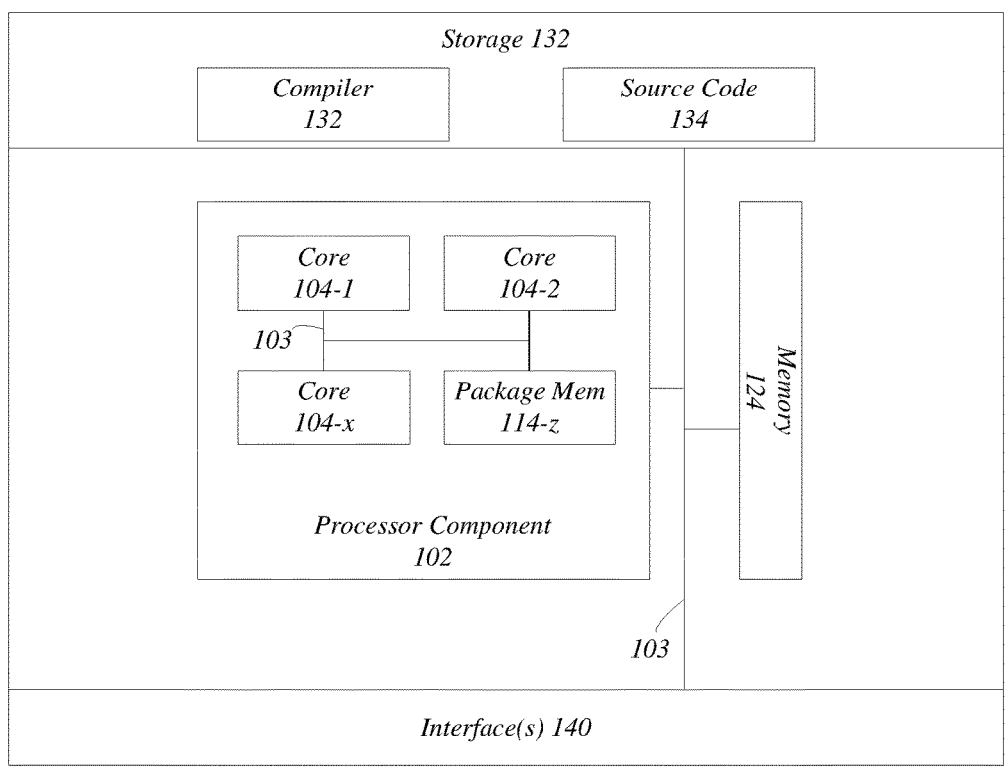
FIG. 1 illustrates an example of a computing system.

Embodiments may generally be directed to optimizations that may be performed by a compiler to remove idle cycles for clock-sensitive threads in simulators by modifying the clock-sensitive threads and transforming them into equivalent methods. A clock-sensitive thread is a particular kind of process that is used to model synchronous digital circuits. For example, the clock-sensitive thread is a stackful co-routine that is activated by a simulation kernel in response to a clock edge or clock event. Clock-sensitive threads can call special functions to suspend and yield control to a simulation kernel, e.g., a wait function call, and generally have local variables. The simulation kernel resumes clock-sensitive threads on the occurrence of a clock edge event. A method is a stackless process and usually in the form of a regular function call by the simulation. Thus, as will be discussed in more detail below, local data of the thread must be extracted and the special functions, e.g., wait function calls, need to be replaced by an implicit state variable.

The clock-sensitive threads may be part of source code to perform simulations for system-level modeling, architectural exploration, performance modeling software development, functional verification, virtual prototyping, and high-level synthesis. Experiments have shown that these simulations can be dominated by idle cycles during runtime when clock-sensitive threads are executed on each clock edges but do not change the model state. The idle cycles consume processing time and decrease simulation speed, especially when integrating the model into full-chip virtual platforms. Thus, embodiments discussed herein are directed to transforming the clock-sensitive threads to methods that they do not activate unless there is an input signal change event and/or a variable change event.

Reference is now made to the drawings, wherein like reference numerals are used to refer to like elements throughout. In the following description, for purposes of explanation, numerous specific details are set forth to provide a thorough understanding thereof. It may be evident, however, that the novel embodiments can be practiced without these specific details. In other instances, well-known structures and devices are shown in block diagram form in order to facilitate a description thereof. The intention is to cover all modifications, equivalents, and alternatives consistent with the claimed subject matter.

FIG. 1 illustrates an example embodiment of a system 100 in which aspects of the present disclosure may be employed to analyze source code, detect clock-sensitive threads that may execute on idle cycles, and perform a transformation on the clock-sensitive threads such that they only activate under particular circumstances, such as a change in an input signal or a variable. The system 100 may be computing device, such as a personal computer, desktop computer, tablet computer, netbook computer, notebook computer, laptop computer, a mobile computing device, a server, server farm, blade server, a rack-based server, a rack-based processing board, and so forth. Embodiments are not limited in this manner.

In embodiments, the system 100 includes devices, circuitry, memory, storage, and components to perform operations discussed herein. In the illustrated example, the system 100 includes a processor component 102 including processing circuitry, which may be a central processing unit (CPU), multi-component packet (MCP), or the like. The processor component 102 can include one or more cores 104-$x$, where x may be any positive integers, and package memory 114-$z$, where z may be any positive integer. The package memory 114 may be volatile memory, such as cache that can be used by the other components of the processor component 102 to process information and data, for example.

The system 100 may include other components, such as memory 124, storage 132, and one or more interfaces 140. The memory 124, storage 132, and the one or more interfaces 140 may be coupled via one or more interconnects 103. In embodiments, the memory 124 may be one or more of volatile memory including random access memory (RAM) dynamic RAM (DRAM), static RAM (SRAM), double data rate synchronous dynamic RAM (DDR SDRAM), SDRAM, DDR1 SDRAM, DDR2 SDRAM, SSD3 SDRAM, single data rate SDRAM (SDR SDRAM), DDR3, DDR4, and so forth. Embodiments are not limited in this manner, and other memory types may be contemplated and be consistent with embodiments discussed herein. For example, the memory 124 may be a three-dimensional crosspoint memory device, or other byte addressable write-in-place nonvolatile memory devices. In embodiments, the memory devices may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin-transfer torque (STT)-MRAM, a spintronic magnetic junction memory based device, a magnetic tunneling junction (MTJ) based device, a DW (Domain Wall) and SOT (Spin-Orbit Transfer) based device, a thyristor-based memory device, or a combination of any of the above, or other memory.

In embodiments, the system 100 includes one or more interface(s) 140 to communicate data and information with other compute systems, for example. An interface 140 may be capable of communicating via a fabric network or an Ethernet network, optically and/or electrically. Examples of an interface 140 include a Universal Serial Bus (USB) ports/adapters, IEEE 1394 Firewire ports/adapters, and so forth. Additional examples of interfaces 140 include parallel interfaces, serial interfaces, and bus interfaces. Embodiments are not limited in this manner.

In embodiments, the system 100 includes storage 132, such as non-volatile storage, which may further include an operating system (not shown) or system software that manages the system's 100 hardware and software resources and to provide common services for computer programs, software applications, and hardware components. The operating system may be a Windows® based operating system, an Apple® based on operating system, a Unix® based operating system, and so forth.

The storage 132 also includes a compiler 132 and source code 134. The source code 134 includes one or more instructions to perform tasks, such as performing simulations for system-level modeling, architectural exploration, performance modeling software development, functional verification, virtual prototyping, and high-level synthesis. In embodiments, the compiler 132 includes a program or set of programs to translate the source code 134 into target text/code, such as the binaries. In some instances, the compilation of source code 134 with the compiler 132 is done in multiple phases and passes to transform high-level programming language code into low-level machine or assembly language code, e.g., binaries. The compiler 132 may utilize any compilation techniques and perform any compiler operations, such as lexical analysis, preprocessing, parsing, semantic analysis, code generation, code transformation, and code optimization. The compiler 132 may compile and optimize code as part of the build flow by detecting clock-sensitive threads that may have a high number of idle cycles, and transforming the clock-sensitive threads into methods such that they only execute when specific events occur, e.g., a change in input data or change in a variable.

In embodiments, the compiler 132 may analyze the source code during a build cycle to detect portions of the code, such as the clock-sensitive threads, that can have a significant number of idle cycles during execution. An idle cycle occurs when a clock-sensitive thread is activated and evaluated but does not change the state of the executing software, for example. Thus, the idle cycles are redundant activations that may be removed from the source code reducing processing cycles and memory usages when performing modeling.

The compiler 132 may detect a clock-sensitive thread in the source code, and perform a transformation including generating two new methods, an activation method and an evaluation method to perform an equivalent task as the clock-sensitive thread. Each of the clock-sensitive threads may be transformed into corresponding activation methods and evaluation methods. Further, each of the clock-sensitive threads may perform a task or calculation, which, after the transformation, may be performed by the corresponding activation and evaluation methods. In some embodiments, the clock-sensitive threads may be SystemC clocked threads (SC_CTHREAD) and may be transformed into equivalent data-sensitive SystemC methods (SC_METHOD), e.g., the activation and evaluation methods. The compiler 132 may detect all the SC_CTHREADs when performing a transformation, for example.

In embodiments, the compiler 132 may modify the clock-sensitive thread as part of the transformation process. For example, to convert the clock-sensitive thread into a method the compiler 132 may in-line user-defined functions of the clock-sensitive thread, convert loops into if plus goto format in the methods, and replace local variables of the clock-sensitive thread with member variables of the enclosing module. Thus, it will extract all stack-allocated variables into a module scope.

To remove wait function calls from a clock -sensitive thread, the compiler needs to replace it with an explicit state-machine by assigning a unique label to each wait function call in the clock-sensitive thread. More specifically, the compiler 132 may generate a state variable value, a goto statement, and a state label in the evaluation method for each wait function call in the clock-sensitive thread. When the processing flow is at a point of execution where a wait function call would have occurred, the state variable value replacing the wait function call is now utilized and assigned to the state variable generated for the class. The state label may be utilized by a switch statement to jump to a portion of code to assign the next state value to the state variable, as will be discussed in more detail below. Table 1 below illustrated one example code snippet of a clock-sensitive thread including a wait function call replaced by code in the evaluation method. Note that after the transformation, the clock-sensitive thread is no longer active and is replaced by the activation and evaluation methods.

TABLE 1

| // clock-sensitive thread (original code) |
| wait( );   // State S1 |
| // evaluation method (transformed code) |
| s = S1;   // Assign state variable |
| goto END_FUNC; // Jump to "end of function" label |
| S1_START:;   // State label |

Further, Table 2 below illustrates an example code snippet of the switch state that may be generated by the compiler 132 in the evaluation method and maps the current state to a jump to the state label, e.g., "S1_START."

TABLE 2

| // Jump to state label (evaluation method) |
| switch (s) { |
| case S1 : goto S1_START; break; |
| ... |
| } |

In embodiments, to generate the state-machine, the compiler 132 determines one or more state transitions for each state variable value, which may be utilized to generate the switch statement in the evaluation method to map a current state variable to jump to a state variable value based on the one or more state transitions. In some embodiments, the compiler 132 builds a control flow graph (CFG) that may be utilized to determine the transition states and extracts a minimal set of state transition events to generate the state-machine. For example, the compiler 132 may generate a CFG where each vertex in the CFG corresponds to a state variable value associated with a wait function call in the clock-sensitive thread. Each edge of the CFG encloses all paths between two consecutive state variable values. Further, the compiler 132 may find all loop edges of the CFG, wherein a loop edge is an edge that connects a vertex to itself. The compiler 132 may utilize the CFG and the loop edges to determine where redundant activations may occur. During execution of the compiled source code, computations performed on the non-looped edges change the state variable and therefore, are not redundant. Redundant activations are possible only on loop edges. The compiler 132 may generate variables that have values assigned at the loop edge and may be used at the next iteration of the loop edge. These variables may be called significant variables. There could be multiple such variables, and significant variables can be found with live variable analysis going backwards from state variable assignment.

As previously illustrated in Table 1, the compiler 132 may also include a goto statement in the evaluation method as part of the replacement of a wait function call. The goto statement may direct the flow of execution to the end of the evaluation method to perform a check to determine if one or more of the state variable has changed and/or the significant variable has changed. Table 3 below illustrates a code snippet of the end of function checks that may be included in the evaluation method.

TABLE 3

```
END_FUNC:   // End of function label
if (s != s_prev || a != a_prev) {
        var_change_event.notify( );   // Variable change notification
s_prev = s; ...
}
```

The compiler 132 also generates the activation method that generates a timed notification in response to an input data change event, generated by other threads in a simulator, a significant variable, or state variable change event. In embodiments, the evaluation method may generate a variable change event as illustrated in table 3. In the illustrated example, "s" may be the state variable and "a" may be the significant variable. Thus, if either one does not equal their previous values, a variable has changed. Either the state variable or significant variable, or both. The evaluation method may trigger the var_change_event.notify( ) notification on which the activation method may trigger. As mentioned, the activation method may generate the timed notification. Timed notification is used to activate evaluation method again. The time of notification is determined by the clock period of the original clocked thread.

In embodiments, the compiler 132 may output new source code including the activation method and the evaluation method; the new source code can execute based on the input changes or the variable changes, and not during idle cycles. Moreover, the activation method and evaluation method effectively replace a clock-sensitive thread and performs the same task or calculation as the clock-sensitive thread. Table 4 illustrates an example of the source code including the activation method and the evaluation. Note that, although not shown, the original thread code may be in-lined to prevent from executing.

TABLE 4

```
// Original thread code
void func_thread( ){
   while (true) {
      ...
      wait( );
      ...
   }
}
   // Result code
   sc_uint<STATE_WIDTH> s;           // State variable
   T a;                              // Significant variable
   sc_uint<STATE_WIDTH> s_prev;// Previous value
   of state variable
   T a_prev;                         // Previous value of
                                     significant variable
   sc_event  clk_period_event;
   sc_event  var_change_event;
   // Activation method, sensitive to var_change_event and input
   signals
   void activate_method( ) {
      clk_period_event.notify(CLK_PERIOD); // Clock period value
   }
   // Evaluation method, sensitive to clk_period_event
   void evaluation_method( ){
      // Jump to state label
      switch (s) {
         case S1 : goto S1_START; break;
         ...
      }
   ...
   s = S1;  // Assign state variable
   goto END_FUNC;
   S1_START:;    // State label
   ...
   END_FUNC:   // End of function label
   if (s != s_prev || a != a_prev) {
         var_change_event.notify( );   // Variable change notification
   s_prev = s; a_prev = a;
   }
}
```

Figure 2A:
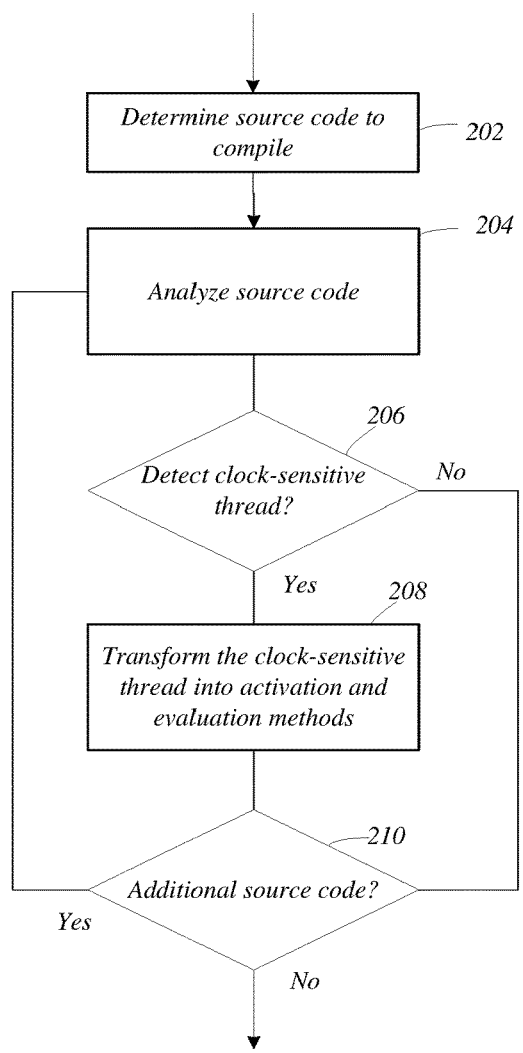
FIG. 2A illustrates an example of a processing flow.

FIG. 2A illustrates an example of a logic flow 200 that may be representative of some or all the operations executed by one or more embodiments described herein. For example, the processing flow 200 may illustrate operations performed by system 100 including the compiler 132. However, embodiments are not limited in this manner, and one or more other components may perform operations to enable and support the operations discussed in this processing flow 200.

At block 202, the logic flow 200 includes determining source code to compile and build. In some embodiments, the source code may be provided to a compiler via one or more computing processes in response to a user input or selection. The source code may also be provided to the compiler via one or more computing processes automatically, on a periodic or semi-periodic basis. In embodiments, the source code may be utilized to perform simulations for system-level modeling, architectural exploration, performance modeling software development, functional verification, virtual prototyping, and high-level synthesis. For example, the source code may be in a hardware description language (HDL), such as SystemC, to describe structure, electronic circuitry, digital logic, and so forth. SystemC is a C++ class library that enables functional modeling of systems.

In embodiments, the logic flow 200 includes analyzing the source code during a build cycle to detect portions of the code, such as clock-sensitive threads, that have a significant number of idle cycles during execution at block 204. The idle cycles are redundant activations that may be removed from the source code reducing processing cycles and memory usages when performing modeling.

At decision block 206, a determination may be made as to whether a clock-sensitive thread is detected in a portion of the source code. If not, the processing flow 200 may determine whether any additional source code remains at block 210 and if so continue to analyze the source code. If no source code remains at block 210, the logic flow 200 may end. If at decision block 206 a clock-sensitive thread is detected, the logic flow 200 includes performing a transformation operation on the clock-sensitive thread transforming into an activation method and an evaluation method at block 208. The activation method and evaluation method may replace the clock-sensitive thread and perform the same task or calculation. Further, the activation method and evaluation method may execute in response to particular events, such as a change in input data or a change in a variable, and do not execute during idle cycles.

In embodiments, the logic flow 200 may repeat until the source code is completely analyzed and each of the clock-sensitive threads may be transformed into corresponding activation methods and evaluation methods. Further, each of the clock-sensitive threads may perform a task or calculation, which, after the transformation, may be performed by the corresponding activation and evaluation methods. In one example, the clock-sensitive threads may be SystemC clocked threads (SC_CTHREAD) and may be transformed into equivalent data-sensitive SystemC methods (SC_METHOD). However, embodiments are not limited in this manner.

Figure 2B:
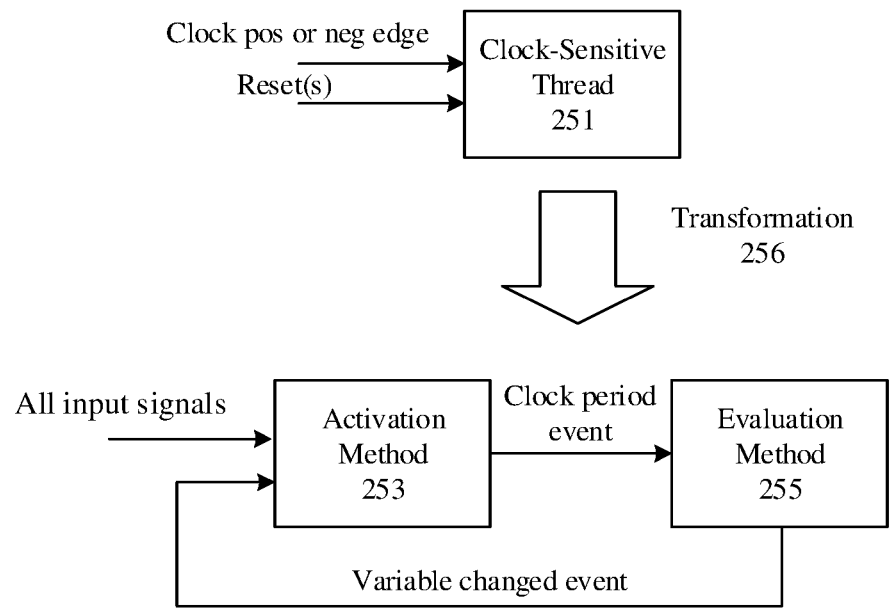
FIG. 2B illustrates an example of a second processing flow.

FIG. 2B illustrates one example block diagram 250 of a transformation process 256 performed by a compiler. In the illustrated example, a clock-sensitive thread 251 may receive a number of inputs including clock edge event on which it may trigger and one or more resets. As previously discussed, the clock-sensitive thread 251 executing on a clock edge (positive or negative) has a number of idle cycles in which the thread is not actually performing a task or calculation. Thus, a compiler may perform a transformation operation 256 to transform the clock-sensitive thread 251 into two methods, an activation method 253 and an evaluation method 255. The activation method 253 may generate a timed notification in response to an input data change received as one or more input signals and/or a variable change (state variable or significant variable) initiated by the evaluation method 255. The time notification may replicate or correspond with a clock edge of a clock generated during a simulation. For example, the source code may include a system clock instruction to replicate a clock during simulation. The transformation operation 256 may detect or determine this system clock instruction and utilize it when generating the activation method 253. Thus, the activation method 253 may cause a clock period event including the time notification based on and in sync with the system clock instruction in the original source code. In the illustrated example, the activation method 253 and evaluation method 255 may only execute when a change event occurs causing the simulation and system to utilize less processing cycles and eliminating idle cycles.

Figure 3A:
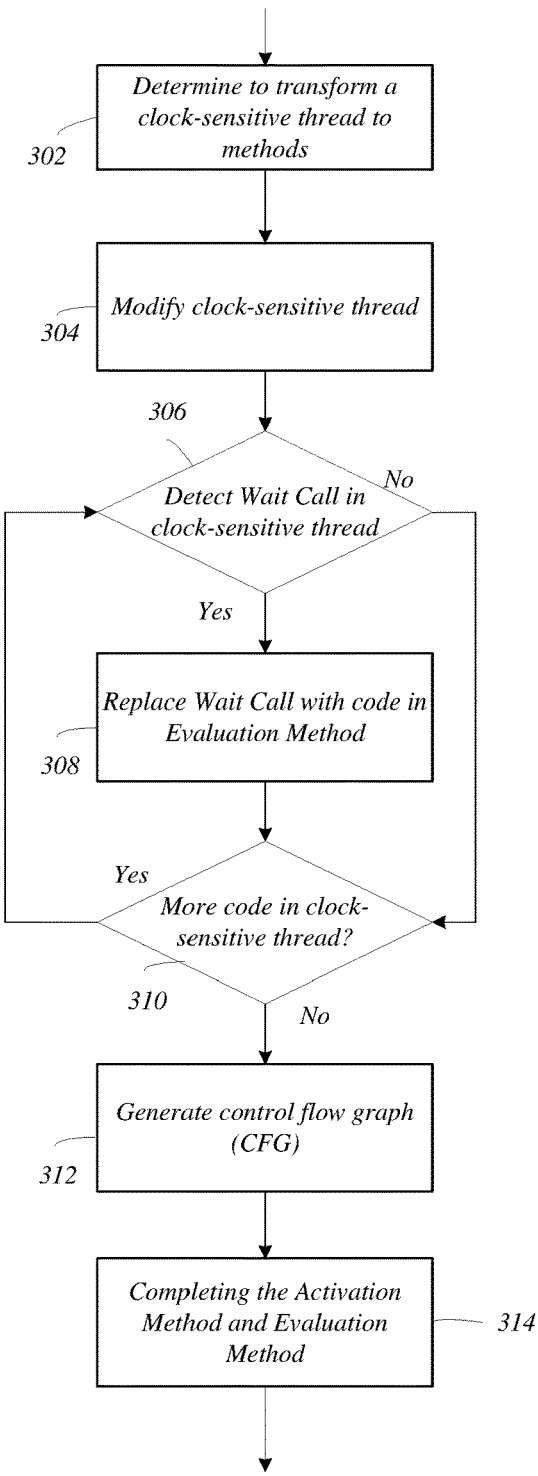
FIG. 3A illustrates an example of a flow diagram.

FIG. 3A illustrates an example of a logic flow 300 that may be representative of some or all the operations executed by one or more embodiments described herein to perform a transformation process. For example, the processing flow 300 may illustrate one or more detailed operations performed by system 100 including the compiler 132 that may occur at block 208 of FIG. 2A. However, embodiments are not limited in this manner, and one or more other components may perform operations to enable and support the operations discussed in this processing flow 300.

At block 302, the logic flow 300 includes determining to perform a transformation operation to transform a clock-sensitive thread into an activation method and an evaluation method. More specifically, a compiler during a build process may determine that a portion of source code includes a clock-sensitive thread.

In embodiments, the logic flow 300 includes modifying the clock-sensitive thread at block 304. For example, the compiler can in-line user-defined functions of the clock-sensitive thread, convert loops into if plus goto format, and replace local variables of the clock-sensitive thread with member variables of the activation and evaluation methods. At block 306, a compiler analyzes the clock-sensitive thread to determine whether there are any wait function calls. If not, the logic flow 300 may proceed to block 310 and determine whether more code exists in the clock-sensitive thread. However, if the compiler detects one or more wait function calls in the clock-sensitive thread, the compiler may replace each wait function call detected with a code triple in the evaluation method at block 308 and as illustrated in table 1. Each code triple includes a state variable value assignment, a goto statement, and a state label. The state variable value assignment may be code in the evaluation method to assign the state variable the state variable value associated with the wait call. The goto statement may be part of a switch statement or clause to jump to the state label if the state value is the state variable value in the evaluation method. Further, the state label is utilized as part of the switch statement and causes execution to jump to a different portion the evaluation method to execution an end function and check if there is a variable change.

In embodiments, the logic flow 300 may perform operations at blocks 306-310 until the entire clock-sensitive thread is evaluated and each wait function call is replaced by the triple, as illustrated in example table 1. At block 312, the compiler generates a CFG. The CFG may be utilized to determine the transition states and extracts a minimal set of state transition events. For example, the compiler 132 may generate a CFG where each vertex in the CFG corresponds to a state variable value associated with a wait function call in the clock-sensitive thread. Each edge of the CFG encloses all paths between two consecutive state variable values. Further, the compiler 132 may find all loop edges of the CFG, wherein a loop edge is an edge that connects a vertex to itself.

Figure 3B:
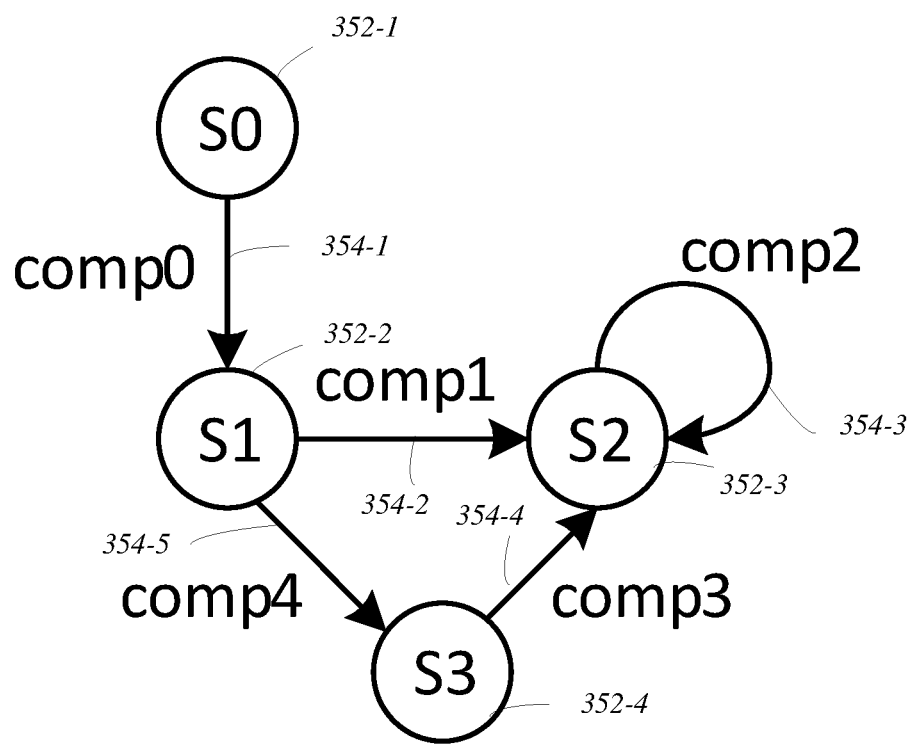
FIG. 3B illustrates an example of a state transition diagram.

FIG. 3B illustrates one example of a CFG 350 having a number of vertices 352-1 through 352-4 corresponding to a state and state value and coupled to each other via edges 354-1 through 354-5. Each of the edges 354-1 through 354-5 represents a possible transition from one state to another state based on a computation performed. Further, edge 354-3 is a loop edge that connects vertex (S2) 352-3 to itself. In this example, the compiler 132 may utilize the CFG 350 and the loop edges to determine where redundant activations may occur. During execution of the compiled source code, computations performed on the non-looped edges change the state variable in the class; and therefore, are not redundant. If the state variable is assigned a state variable value at the loop edge, the state variable may be used during a next iteration. In other words, the state may stay the same during the next iteration of execution of the compiled source code. The compiler 132 may generate a significant variable to track redundant activations and used at a next iteration of a loop edge of the CFG 350. The significant variables are found with live variable analysis during execution of the modified source code by going backwards from state variable assignments. Embodiments are not limited by the example CFG 350 illustrated in FIG. 3B.

With reference back to FIG. 3A, at block 314, the logic flow 300 includes completing the generation of the activation method and the evaluation method. For example, the compiler generates the activation method including source code that is sensitive to a variable or input change event and a clock period notify to send the timed notification to the evaluation method. As previously mentioned, the timed notification may represent and indicate a clock edge (positive or negative) to the evaluation method and cause the evaluation method to execute. Further, the compiler may complete the evaluation method including completing the switch statement, ensuring that each triple for each wait function call is present, and generating the end function block to check if there is a change in a state variable and/or a significant variable. Embodiments are not limited in this manner. Table 4 illustrates example code which may be like the final source code after the transformation.

FIGS. 4A/4B illustrate examples of timing charts 400 and 450, respectively. Timing chart 400 represents activity during execution of source code prior to transforming clock-sensitive threads. As illustrated in timing chart 400, the clock-sensitive thread 405 includes a number of redundant activations, e.g., idle cycles, on each positive edge of the clock 401. Thus, a considerable amount of processing resources may be wasted to process these redundant activations. In the illustrated example, there is only a single input data change 403 which causes a change internal to the clock-sensitive thread.

FIG. 4B illustrates an example timing diagram 450 which may occur after a clock-sensitive thread is transformed into an activation method and evaluation method. In the illustrated example, the activation method 455 may trigger on an input data changes 453 and send a timed notification to the evaluation method 455. The evaluation method 455 may execute in response to the timed notification (and input data change) that may cause a variable change event further triggering the activation method 455 and the evaluation method 457 again. Once the activation method 455 and evaluation method 457 finish processing the input data change 453 and variable change events, they may remain inactive until another input data change or variable change event occurs. Thus, the number of idle cycles is reduced and/or eliminated.

Figure 5:
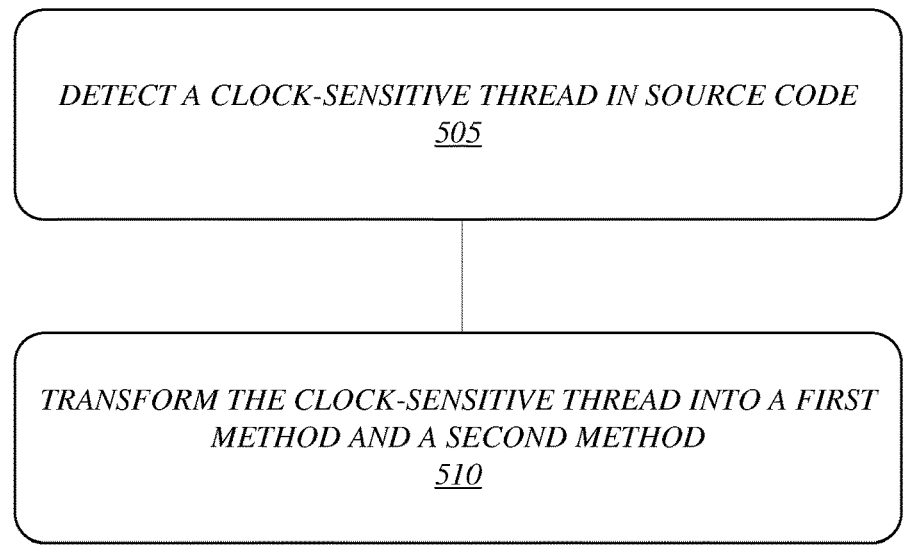
FIG. 5 illustrates an example embodiment of a logic flow diagram.

FIG. 5 illustrates an example of a logic flow 500 that may be representative of some or all of the operations executed by one or more embodiments described herein. For example, the logic flow 500 may illustrate operations performed by a system including a compiler, as described herein.

At block 505, the logic flow 500 may include detecting a clock-sensitive thread in source code. For example, a compiler may analyze the source code during a build cycle to detect portions of the code, such as clock-sensitive threads, that have a significant number of idle cycles during execution. The idle cycles are redundant activations that may be removed from the source code reducing processing cycles and memory usages when performing modeling.

At block 510, the logic flow 500 includes transforming the clock-sensitive thread into a first method and a second method. In embodiments, the first method generates a timed notification in response to an input data change or a variable change, the timed notification corresponding with a clock edge of a clock, and the second method executes the task in response to the timed notification. In embodiments, the first method is an activation method and the second method is an evaluation method. The activation method and evaluation method may replace the clock-sensitive thread and perform the same task or calculation. Further, the activation method and evaluation method may execute in response to particular events, such as a change in input or a change in a variable, and do not execute during idle cycles.

Embodiments include transforming each of the clock-sensitive threads to corresponding activation and evaluation methods, which may perform a particular task or calculation. In one example, the clock-sensitive threads may be SystemC clocked threads (SC_CTHREAD) and may be transformed into equivalent data-sensitive SystemC methods (SC_METHOD), the activation and evaluation methods. However, embodiments are not limited in this manner.

Figure 6:
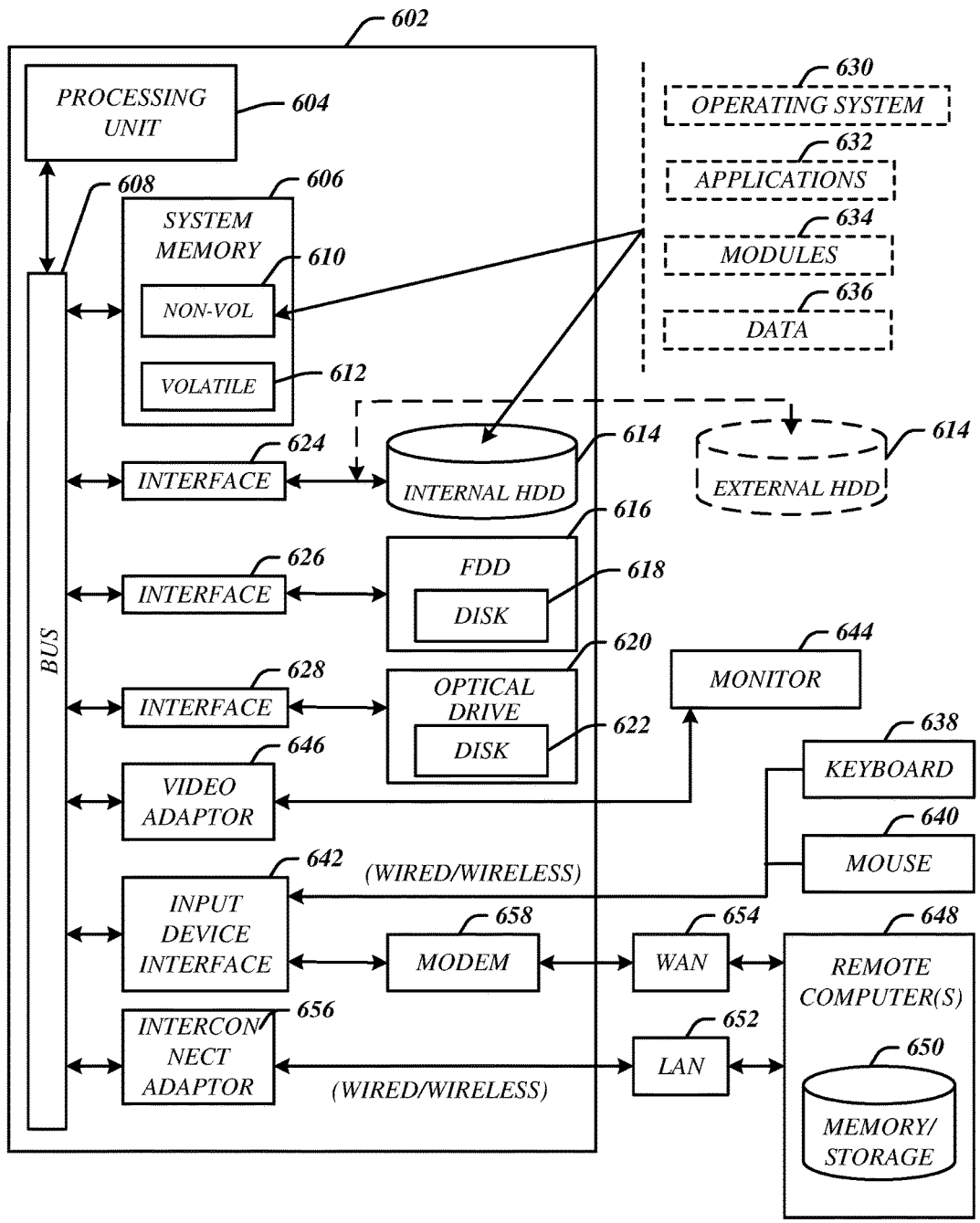
FIG. 6 illustrates an example embodiment of a computing architecture.

FIG. 6 illustrates an embodiment of an exemplary computing architecture 600 suitable for implementing various embodiments as previously described. In embodiments, the computing architecture 600 may include or be implemented as part of a node, for example.

As used in this application, the terms "system" and "component" are intended to refer to a computer-related entity, either hardware, a combination of hardware and software, software, or software in execution, examples of which are provided by the exemplary computing architecture 600. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components can reside within a process and thread of execution, and a component can be localized on one computer and distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

The computing architecture 600 includes various common computing elements, such as one or more processors, multi-core processors, co-processors, memory units, chipsets, controllers, peripherals, interfaces, oscillators, timing devices, video cards, audio cards, multimedia input/output (I/O) components, power supplies, and so forth. The embodiments, however, are not limited to implementation by the computing architecture 600.

As shown in FIG. 6, the computing architecture 600 includes a processing unit 604, a system memory 606 and a system bus 608. The processing unit 604 can be any of various commercially available processors.

The system bus 608 provides an interface for system components including, but not limited to, the system memory 606 to the processing unit 604. The system bus 608 can be any of several types of bus structure that may further interconnect to a memory bus (with or without a memory controller), a peripheral bus, and a local bus using any of a variety of commercially available bus architectures. Interface adapters may connect to the system bus 608 via a slot architecture. Example slot architectures may include without limitation Accelerated Graphics Port (AGP), Card Bus, (Extended) Industry Standard Architecture ((E)ISA), Micro Channel Architecture (MCA), NuBus, Peripheral Component Interconnect (Extended) (PCI(X)), PCI Express, Personal Computer Memory Card International Association (PCMCIA), and the like.

The computing architecture 600 may include or implement various articles of manufacture. An article of manufacture may include a computer-readable storage medium to store logic. Examples of a computer-readable storage medium may include any tangible media capable of storing electronic data, including volatile memory or non-volatile memory, removable or non-removable memory, erasable or non-erasable memory, writeable or re-writeable memory, and so forth. Examples of logic may include executable computer program instructions implemented using any suitable type of code, such as source code, compiled code, interpreted code, executable code, static code, dynamic code, object-oriented code, visual code, and the like. Embodiments may also be at least partly implemented as instructions contained in or on a non-transitory computer-readable medium, which may be read and executed by one or more processors to enable performance of the operations described herein.

The system memory 606 may include various types of computer-readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory, solid state drives (SSD) and any other type of storage media suitable for storing information. In the illustrated embodiment shown in FIG. 6, the system memory 606 can include non-volatile memory 610 and volatile memory 612. A basic input/output system (BIOS) can be stored in the non-volatile memory 610.

The computer 602 may include various types of computer-readable storage media in the form of one or more lower speed memory units, including an internal (or external) hard disk drive (HDD) 614, a magnetic floppy disk drive (FDD) 616 to read from or write to a removable magnetic disk 616, and an optical disk drive 620 to read from or write to a removable optical disk 622 (e.g., a CD-ROM or DVD). The HDD 614, FDD 616 and optical disk drive 620 can be connected to the system bus 608 by an HDD interface 624, an FDD interface 626 and an optical drive interface 626, respectively. The HDD interface 624 for external drive implementations can include at least one or both of Universal Serial Bus (USB) and IEEE 1394 interface technologies.

The drives and associated computer-readable media provide volatile and nonvolatile storage of data, data structures, computer-executable instructions, and so forth. For example, a number of program modules can be stored in the drives and memory units 610, 612, including an operating system 630, one or more application programs 632, other program modules 634, and program data 636. In one embodiment, the one or more application programs 632, other program modules 634, and program data 636 can include, for example, the various applications and components of the system 100.

A user can enter commands and information into the computer 602 through one or more wire/wireless input devices, for example, a keyboard 636 and a pointing device, such as a mouse 640. Other input devices may include microphones, infra-red (IR) remote controls, radio-frequency (RF) remote controls, game pads, stylus pens, card readers, dongles, finger print readers, gloves, graphics tablets, joysticks, keyboards, retina readers, touch screens (e.g., capacitive, resistive, etc.), trackballs, track pads, sensors, styluses, and the like. These and other input devices are often connected to the processing unit 604 through an input device interface 642 that is coupled to the system bus 608, but can be connected by other interfaces such as a parallel port, IEEE 1394 serial port, a game port, a USB port, an IR interface, and so forth.

A monitor 644 or other type of display device is also connected to the system bus 608 via an interface, such as a video adaptor 646. The monitor 644 may be internal or external to the computer 602. In addition to the monitor 644, a computer typically includes other peripheral output devices, such as speakers, printers, and so forth.

The computer 602 may operate in a networked environment using logical connections via wire and wireless communications to one or more remote computers, such as a remote computer 646. The remote computer 646 can be a workstation, a server computer, a router, a personal computer, portable computer, microprocessor-based entertainment appliance, a peer device or other common network node, and typically includes many or all of the elements described relative to the computer 602, although, for purposes of brevity, only a memory/storage device 660 is illustrated. The logical connections depicted include wire/wireless connectivity to a local area network (LAN) 662 and larger networks, for example, a wide area network (WAN) 664. Such LAN and WAN networking environments are commonplace in offices and companies and facilitate enterprise-wide computer networks, such as intranets, all of which may connect to a global communications network, for example, the Internet.

When used in a LAN networking environment, the computer 602 is connected to the LAN 662 through a wire and/or wireless communication network interface or adaptor 666. The adaptor 666 can facilitate wire and/or wireless communications to the LAN 662, which may also include a wireless access point disposed thereon for communicating with the wireless functionality of the adaptor 666.

When used in a WAN networking environment, the computer 602 can include a modem 666, or is connected to a communications server on the WAN 664, or has other means for establishing communications over the WAN 664, such as by way of the Internet. The modem 666, which can be internal or external and a wire and/or wireless device, connects to the system bus 608 via the input device interface 642. In a networked environment, program modules depicted relative to the computer 602, or portions thereof, can be stored in the remote memory/storage device 660. It will be appreciated that the network connections shown are exemplary and other means of establishing a communications link between the computers can be used.

The computer 602 is operable to communicate with wire and wireless devices or entities using the IEEE 602 family of standards, such as wireless devices operatively disposed in wireless communication (e.g., IEEE 602.11 over-the-air modulation techniques). This includes at least Wi-Fi (or Wireless Fidelity), WiMax, and Bluetooth™ wireless technologies, among others. Thus, the communication can be a predefined structure as with a conventional network or simply an ad hoc communication between at least two devices. Wi-Fi networks use radio technologies called IEEE 602.116 (a, b, g, n, etc.) to provide secure, reliable, fast wireless connectivity. A Wi-Fi network can be used to connect computers to each other, to the Internet, and to wire networks (which use IEEE 602.3-related media and functions).

The various elements of the devices as previously described with reference to FIGS. 1-6 may include various hardware elements, software elements, or a combination of both. Examples of hardware elements may include devices, logic devices, components, processors, microprocessors, circuits, processors, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. However, determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

The detailed disclosure now turns to providing examples that pertain to further embodiments. Examples one through thirty-three provided below are intended to be exemplary and non-limiting.

In a first example, a system, a device, an apparatus, and so forth may include memory storing instructions, and processing circuitry coupled with the memory, the processing circuitry operable to execute the instructions, that when executed, enable processing circuitry to detect a clock-sensitive thread in source code, the clock-sensitive thread to execute a task, and transform the clock-sensitive thread into a first method and a second method, the first method to generate a timed notification in response to an input data change or a variable change, the timed notification corresponding with a clock edge of a clock, and the second method to execute the task in response to the timed notification.

In a second example and in furtherance of the first example, the system, the device, the apparatus, and so forth including the processing circuitry to transform the clock-sensitive thread into the first method and the second method comprising in-lining user-defined functions of the clock-sensitive thread, converting loops into if plus goto format, and replacing local variables of the clock-sensitive thread with member variables of the first method and the second method.

In a third example and in furtherance of any previous example, the system, the device, the apparatus, and so forth including the processing circuitry to transform the clock-sensitive thread into the first method and the second method comprising replacing each wait function call in the clock-sensitive thread with a state variable value assignment, a goto statement, and a state label in the second method.

In a fourth example and in furtherance of any previous example, the system, the device, the apparatus, and so forth including the processing circuitry to determine one or more state transitions for each state variable value and generate a switch statement in the second method to map a current state variable value to jump to an associated state label based on the one or more state transitions.

In a fifth example and in furtherance of any previous example, the system, the device, the apparatus, and so forth including the processing circuitry to determine each state transition of the one or more state transition that transitions to itself and associate a significant variable.

In a sixth example and in furtherance of any previous example, the system, the device, the apparatus, and so forth including the processing circuitry to generate an end function block in the second method to indicate the variable change to the first method in response to at least one of a change of a state variable, a change of a significant variable, or both.

In a seventh example and in furtherance of any previous example, the system, the device, the apparatus, and so forth including the processing circuitry to execute the instructions during compiling of the source code.

In an eighth example and in furtherance of any previous example, the system, the device, the apparatus, and so forth including the processing circuitry to output new source code including the first method and the second method, the new source code to execute the first method and the second method based on the input change or the variable change, and not during idle cycles.

In a ninth example and in furtherance of any previous example, the system, the device, the apparatus, and so forth including a display coupled with the processing circuitry and the memory, the display to display the new source code.

In a tenth example and in furtherance of any previous example, a non-transitory computer-readable storage medium, comprising a plurality of instructions, that when executed, enable processing circuitry to detect a clock-sensitive thread in source code, the clock-sensitive thread to execute a task, and transform the clock-sensitive thread into a first method and a second method, the first method to generate a timed notification in response to an input data change or a variable change, the timed notification corresponding with a clock edge of a clock, and the second method to execute the task in response to the timed notification.

In an eleventh example and in furtherance of any previous example, a non-transitory computer-readable storage medium, comprising a plurality of instructions, that when executed, enable processing circuitry to transform the clock-sensitive thread into the first method and the second method comprising in-lining user-defined functions of the clock-sensitive thread, converting loops into if plus goto format, and replacing local variables of the clock-sensitive thread with member variables of the first method and the second method.

In a twelfth example and in furtherance of any previous example, a non-transitory computer-readable storage medium, comprising a plurality of instructions, that when executed, enable processing circuitry to transform the clock-sensitive thread into the first method and the second method comprising replacing each wait function call in the clock-sensitive thread with a state variable value assignment, a goto statement, and a state label in the second method.

In a thirteenth example and in furtherance of any previous example, a non-transitory computer-readable storage medium, comprising a plurality of instructions, that when executed, enable processing circuitry to determine one or more state transitions for each state variable value and generate a switch statement in the second method to map a current state variable value to jump to an associated state label based on the one or more state transitions.

In a fourteenth example and in furtherance of any previous example, a non-transitory computer-readable storage medium, comprising a plurality of instructions, that when executed, enable processing circuitry to determine each state transition of the one or more state transition that transitions to itself and associate a significant variable.

In a fifteenth example and in furtherance of any previous example, a non-transitory computer-readable storage medium, comprising a plurality of instructions, that when executed, enable processing circuitry to generate an end function block in the second method to indicate the variable change to the first method in response to at least one of a change of a state variable, a change of a significant variable, or both.

In a sixteenth example and in furtherance of any previous example, a non-transitory computer-readable storage medium, comprising a plurality of instructions, that when executed, enable processing circuitry to perform the transformation during compiling of the source code.

In a seventeenth example and in furtherance of any previous example, a non-transitory computer-readable storage medium, comprising a plurality of instructions, that when executed, enable processing circuitry to output new source code including the first method and the second method, the new source code to execute the first method and the second method based on the input change or the variable change, and not during idle cycles.

In an eighteenth example and in furtherance of any previous example, a computer-implemented includes detecting a clock-sensitive thread in source code, the clock-sensitive thread to execute a task, and transforming the clock-sensitive thread into a first method and a second method, the first method to generate a timed notification in response to an input data change or a variable change, the timed notification corresponding with a clock edge of a clock, and the second method to execute the task in response to the timed notification.

In a nineteenth example and in furtherance of any previous example, a computer-implemented includes transforming the clock-sensitive thread into the first method and the second method comprising in-lining user-defined functions of the clock-sensitive thread, converting loops into if plus goto format, and replacing local variables of the clock-sensitive thread with member variables of the first method and the second method.

In a twentieth example and in furtherance of any previous example, a computer-implemented includes replacing each wait function call in the clock-sensitive thread with a state variable value assignment, a goto statement, and a state label in the second method.

In a twenty-first example and in furtherance of any previous example, a computer-implemented includes determining one or more state transitions for each state variable value and generate a switch statement in the second method to map a current state variable value to jump to an associated state label based on the one or more state transitions.

In a twenty-second example and in furtherance of any previous example, a computer-implemented includes determining each state transition of the one or more state transition that transitions to itself and associate a significant variable.

In a twenty-third example and in furtherance of any previous example, a computer-implemented includes generating an end function block in the second method to indicate the variable change to the first method in response to at least one of a change of a state variable, a change of a significant variable, or both.

In a twenty-fourth example and in furtherance of any previous example, a computer-implemented includes performing the transformation during compiling of the source code.

In a twenty-fifth example and in furtherance of any previous example, a computer-implemented includes outputting new source code including the first method and the second method, the new source code to execute the first method and the second method based on the input change or the variable change, and not during idle cycles.

In a twenty-sixth example and in furtherance of any previous example, an apparatus or system includes means for detecting a clock-sensitive thread in source code, the clock-sensitive thread to execute a task, and means for transforming the clock-sensitive thread into a first method and a second method, the first method to generate a timed notification in response to an input data change or a variable change, the timed notification corresponding with a clock edge of a clock, and the second method to execute the task in response to the timed notification.

In a twenty-seventh example and in furtherance of any previous example, an apparatus or system includes means for transforming the clock-sensitive thread into the first method and the second method comprising in-lining user-defined functions of the clock-sensitive thread, converting loops into if plus goto format, and replacing local variables of the clock-sensitive thread with member variables of the first method and the second method.

In a twenty-eighth example and in furtherance of any previous example, an apparatus or system includes means for transforming the clock-sensitive thread into the first method and the second method comprising replacing each wait function call in the clock-sensitive thread with a state variable value assignment, a goto statement, and a state label in the second method.

In a twenty-ninth example and in furtherance of any previous example, an apparatus or system includes means for determining one or more state transitions for each state variable value and generate a switch statement in the second method to map a current state variable value to jump to an associated state label based on the one or more state transitions.

In a thirtieth example and in furtherance of any previous example, an apparatus or system includes means for determining each state transition of the one or more state transition that transitions to itself and associate a significant variable.

In a thirty-first example and in furtherance of any previous example, an apparatus or system includes means for generating an end function block in the second method to indicate the variable change to the first method in response to at least one of a change of a state variable, a change of a significant variable, or both.

In a thirty-second example and in furtherance of any previous example, an apparatus or system includes means for performing the transformation during compiling of the source code.

In a thirty-three example and in furtherance of any previous example, an apparatus or system includes means for outputting new source code including the first method and the second method, the new source code to execute the first method and the second method based on the input change or the variable change, and not during idle cycles.

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment. Further, some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to allow a reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment. In the appended claims, the terms "including" and "in which" are used as the plain-English equivalents of the respective terms "including" and "wherein," respectively. Moreover, the terms "first," "second," "third," and so forth, are used merely as labels, and are not intended to impose numerical requirements on their objects.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims.

What is claimed is:

1. An apparatus, comprising:
memory storing executable computer instructions; and
processing circuitry coupled with the memory, the processing circuitry operable to execute the computer instructions, that when executed, enable the processing circuitry to:
detect a clock-sensitive thread in source code, the clock-sensitive thread to execute a task; and
transform the clock-sensitive thread into a first method and a second method, the first method to generate a timed notification in response to an input data change or a variable change, the timed notification corresponding with a clock edge of a clock, and the second method to execute the task in response to the timed notification.

2. The apparatus of claim 1, the processing circuitry to transform the clock-sensitive thread into the first method and the second method comprising in-lining user-defined functions of the clock-sensitive thread, converting loops into if plus goto format, and replacing local variables of the clock-sensitive thread with member variables of the first method and the second method.

3. The apparatus of claim 1, the processing circuitry to transform the clock-sensitive thread into the first method and the second method further comprising replacing each wait function call in the clock-sensitive thread with a state variable value assignment, a goto statement, and a state label in the second method.

4. The apparatus of claim 3, further comprising the processing circuitry to determine one or more state transitions for each state variable value and generate a switch statement in the second method to map a current state variable value to jump to an associated state label based on the one or more state transitions.

5. The apparatus of claim 4, further comprising the processing circuitry to determine each state transition of the one or more state transitions that transitions to itself and associate a significant variable.

6. The apparatus of claim 1, the processing circuitry to generate an end function block in the second method to indicate the variable change to the first method in response to at least one of a change of a state variable, a change of a significant variable, or both.

7. The apparatus of claim 1, the processing circuitry to execute the instructions during compiling of the source code.

8. The apparatus of claim 1, the processing circuitry to output new source code including the first method and the second method, the new source code to execute the first method and the second method based on the input change or the variable change, and not during idle cycles.

9. The apparatus of claim 8, comprising a display coupled with the processing circuitry and the memory, the display to display the new source code.

10. A non-transitory computer-readable storage medium, comprising a plurality of instructions, that when executed, enable processing circuitry to:
detect a clock-sensitive thread in source code, the clock-sensitive thread to execute a task; and
transform the clock-sensitive thread into a first method and a second method, the first method to generate a timed notification in response to an input data change or a variable change, the timed notification corresponding with a clock edge of a clock, and the second method to execute the task in response to the timed notification.

11. The non-transitory computer-readable storage medium of claim 10, comprising a plurality of instructions, that when executed, enable processing circuitry to transform the clock-sensitive thread into the first method and the second method comprising in-lining user-defined functions of the clock-sensitive thread, converting loops into if plus goto format, and replacing local variables of the clock-sensitive thread with member variables of the first method and the second method.

12. The non-transitory computer-readable storage medium of claim 10, comprising a plurality of instructions, that when executed, enable processing circuitry to transform the clock-sensitive thread into the first method and the second method comprising replacing each wait function call in the clock-sensitive thread with a state variable value assignment, a goto statement, and a state label in the second method.

13. The non-transitory computer-readable storage medium of claim 12, comprising a plurality of instructions, that when executed, enable processing circuitry to determine one or more state transitions for each state variable value and generate a switch statement in the second method to map a current state variable value to jump to an associated state label based on the one or more state transitions.

14. The non-transitory computer-readable storage medium of claim 13, comprising a plurality of instructions, that when executed, enable processing circuitry to determine each state transition of the one or more state transition that transitions to itself and associate a significant variable.

15. The non-transitory computer-readable storage medium of claim 10, comprising a plurality of instructions, that when executed, enable processing circuitry to generate an end function block in the second method to indicate the variable change to the first method in response to at least one of a change of a state variable, a change of a significant variable, or both.

16. The non-transitory computer-readable storage medium of claim 10, comprising a plurality of instructions, that when executed, enable processing circuitry to perform the transformation during compiling of the source code.

17. The non-transitory computer-readable storage medium of claim 10, comprising a plurality of instructions, that when executed, enable processing circuitry to output new source code including the first method and the second method, the new source code to execute the first method and the second method based on the input change or the variable change, and not during idle cycles.

18. A computer-implemented method, comprising:
detecting a clock-sensitive thread in source code, the clock-sensitive thread to execute a task; and
transforming the clock-sensitive thread into a first method and a second method, the first method to generate a timed notification in response to an input data change or a variable change, the timed notification corresponding with a clock edge of a clock, and the second method to execute the task in response to the timed notification.

19. The computer-implemented method of claim 18, comprising transforming the clock-sensitive thread into the first method and the second method comprising in-lining user-defined functions of the clock-sensitive thread, converting loops into if plus goto format, and replacing local variables of the clock-sensitive thread with member variables of the first method and the second method.

20. The computer-implemented method of claim 18, comprising transforming the clock-sensitive thread into the first method and the second method comprising replacing each wait function call in the clock-sensitive thread with a state variable value assignment, a goto statement, and a state label in the second method.

21. The computer-implemented method of claim 20, comprising determining one or more state transitions for each state variable value and generate a switch statement in the second method to map a current state variable value to jump to an associated state label based on the one or more state transitions.

22. The computer-implemented method of claim 21, comprising determining each state transition of the one or more state transition that transitions to itself and associate a significant variable.

23. The computer-implemented method of claim 18, comprising generating an end function block in the second method to indicate the variable change to the first method in response to at least one of a change of a state variable, a change of a significant variable, or both.

24. The computer-implemented method of claim 18, comprising performing the transformation during compiling of the source code.

25. The computer-implemented method of claim 18, comprising outputting new source code including the first method and the second method, the new source code to execute the first method and the second method based on the input change or the variable change, and not during idle cycles.

* * * * *